(12) United States Patent
Hirakawa

(10) Patent No.: US 8,490,856 B2
(45) Date of Patent: Jul. 23, 2013

(54) JOINT APPARATUS, JOINT METHOD, AND COMPUTER STORAGE MEDIUM

(75) Inventor: Osamu Hirakawa, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/520,381

(22) PCT Filed: Dec. 27, 2010

(86) PCT No.: PCT/JP2010/073540
§ 371 (c)(1),
(2), (4) Date: Jul. 3, 2012

(87) PCT Pub. No.: WO2011/089827
PCT Pub. Date: Jul. 28, 2011

(65) Prior Publication Data
US 2012/0318856 A1 Dec. 20, 2012

(30) Foreign Application Priority Data
Jan. 20, 2010 (JP) .................................. 2010-010139

(51) Int. Cl.
*B23K 31/02* (2006.01)
*B23K 37/04* (2006.01)

(52) U.S. Cl.
USPC ...................... 228/180.21; 228/44.7; 228/227

(58) Field of Classification Search
USPC ................. 228/4.1, 44.7, 227–232, 6.2, 49.5, 228/180.1–180.22
See application file for complete search history.

(56) References Cited

U.S. PATENT DOCUMENTS

| | | | |
|---|---|---|---|
| 7,040,525 B2 * | 5/2006 | Lee et al. | 228/49.5 |
| 8,286,853 B2 * | 10/2012 | Akiyama et al. | 228/180.21 |
| 2009/0014503 A1 * | 1/2009 | Choi et al. | 228/230 |

FOREIGN PATENT DOCUMENTS

| | | |
|---|---|---|
| JP | A-2004-207436 | 7/2004 |
| JP | A-2007-201196 | 8/2007 |
| JP | A-2009-049081 | 3/2009 |
| JP | A-2009-141043 | 6/2009 |
| JP | A-2010-010628 | 1/2010 |

OTHER PUBLICATIONS

International Search Report mailed on Mar. 8, 2011 in corresponding International Application No. PCT/JP2010/073540 (with English copy enclosed).

* cited by examiner

*Primary Examiner* — Kevin P Kerns
*Assistant Examiner* — Kevin E Yoon
(74) *Attorney, Agent, or Firm* — Posz Law Group, PLC

(57) ABSTRACT

A joint apparatus of the present invention includes: a pre-thermal processing unit including a first thermal processing plate mounting and thermally processing a superposed substrate where substrates are superposed on each other with joint portions of the substrates in contact with each other, and a first pressure reducing mechanism; a joint unit including a second thermal processing plate mounting and thermally processing the superposed substrate processed in the pre-thermal processing unit, a pressurizing mechanism pressing the superposed substrate on the second thermal processing plate toward the second thermal processing plate side, and a second pressure reducing mechanism; and a post-thermal processing unit including a third thermal processing plate mounting and thermally processing the superposed substrate processed in the joint unit, and a third pressure reducing mechanism, wherein each of the pre-thermal processing unit and the post-thermal processing unit is hermetically connected to the joint unit.

9 Claims, 12 Drawing Sheets

JOINT APPARATUS, JOINT METHOD, AND COMPUTER STORAGE MEDIUM

TECHNICAL FIELD

The present invention relates to a joint apparatus, a joint method, and a computer storage medium, each joining substrates having metal joint portions.

BACKGROUND ART

Recently, semiconductor devices become more highly integrated. When a plurality of highly integrated semiconductor devices are arranged within a horizontal plane and connected with one another by wiring into a product, the wiring length may increase to lead to an increase in resistance of the wiring and increase in a wiring delay.

Hence, it is proposed to use the three-dimensional integration technology of integrating the semiconductor devices in three dimensions. In this three-dimensional integration technology, for example, a bonding apparatus is used to bond two semiconductor wafers (hereinafter, referred to as "wafers"). The bonding apparatus has, for example, a fixed table mounting a wafer on its upper surface and a movable table disposed opposite to the fixed table and capable of rising and lowering while suction-holding the wafer on its lower surface. In each of the fixed table and the movable table, a heater is embedded. The bonding apparatus superposes the two wafers and then presses them by applying a load by using the fixed table and movable table while heating the wafers by using the heaters, whereby the two wafers are bonded together (Patent Document 1).

[Patent Document 1] Japanese Laid-open Patent Publication No. 2004-207436

DISCLOSURE OF THE INVENTION

Problems to be Solved by the Invention

Incidentally, there is a case where metal joint portions formed on wafer surfaces are joined to each other when joining two wafers together. In this case, it is necessary to press the wafers while heating the joint portions at a predetermined high temperature. More specifically, it is necessary to sequentially perform first a pre-thermal processing step of heating the wafers up to a predetermined temperature, then a joint step of pressing the wafers with the temperature of the wafers maintained at the predetermined temperature, and then a post-thermal processing step of cooling the wafers.

However, in this case, a lot of time is required to join the two wafers together if using the boding apparatus in Patent Document 1.

First, in the pre-thermal processing step, it takes time to heat the wafers up to the predetermined temperature because the predetermined temperature is a high temperature. In addition, since the joint portions may not be uniformly heated if the wafers are rapidly heated, it is necessary to heat the wafers at a predetermined heating rate or less. Further, since the predetermined temperature is a high temperature, it also takes time to cool the wafers at the high temperature in the post-thermal processing step. In addition, in the case where the joint portions are joined to each other by making them into an alloy, the strengths and the physical properties of the joint portions may change if the wafers are rapidly cooled, so that it is necessary to cool the wafers at a predetermined cooling rate or less. Furthermore, the time required for the joint step cannot be reduced because it is determined depending on the materials used for the joint portions or the like.

A lot of time required for joining the wafers having metal point portions as described above brings about a decrease in throughput of the wafer joint processing.

The present invention has been made in consideration of the above points and its object is to efficiently join substrates having metal joint portions to improve the throughput of substrate joint processing.

Means for Solving the Problems

In order to achieve the above object, the present invention is a joint apparatus joining substrates having metal joint portions, includes: a pre-thermal processing unit including a first thermal processing plate mounting and thermally processing a superposed substrate in which the substrates are superposed on each other with the joint portions in contact with each other, and a first pressure reducing mechanism reducing a pressure of an atmosphere therein down to a predetermined degree of vacuum; a joint unit including a second thermal processing plate mounting and thermally processing the superposed substrate processed in the pre-thermal processing unit, a pressurizing mechanism pressing the superposed substrate on the second thermal processing plate toward the second thermal processing plate side, and a second pressure reducing mechanism reducing a pressure of an atmosphere therein down to a predetermined degree of vacuum; and a post-thermal processing unit including a third thermal processing plate mounting and thermally processing the superposed substrate processed in the joint unit, and a third pressure reducing mechanism reducing a pressure of an atmosphere therein down to a predetermined degree of vacuum, wherein each of the pre-thermal processing unit and the post-thermal processing unit is hermetically connected to the joint unit.

According to the joint apparatus of the present invention, the superposed substrate can be sequentially processed in the pre-thermal processing unit, the joint unit, and the post-thermal processing unit. More specifically, the superposed substrate is first mounted and heated on the first thermal processing plate in the pre-thermal processing unit. Then, the superposed substrate is mounted on the second thermal processing plate and pressed toward the second thermal processing plate side while the superposed substrate is maintained at a second temperature to be joined in the joint unit having an atmosphere therein set at a predetermined degree of vacuum. Then, the superposed substrate is mounted and cooled on the third thermal processing plate in the post-thermal processing unit. During a time when one superposed substrate is processed, another superposed substrate can be processed in parallel at least in the pre-thermal processing unit or the post-thermal processing unit. As described above, according to the present invention, processing can be simultaneously and efficiently performed on two or three superposed substrates even if the predetermined temperature is high, so that the throughput of the substrate joint processing can be improved.

The present invention according to another aspect is a joint method of joining substrates having metal joint portions, including: a pre-thermal processing step of mounting a superposed substrate in which the substrates are superposed on each other with the joint portions in contact with each other, on a first thermal processing plate and heating the superposed substrate up to a first temperature in a pre-thermal processing unit; a joint step of then mounting the superposed substrate on a second thermal processing plate and pressing the superposed substrate toward the second thermal processing plate side while maintaining the superposed substrate at a second temperature higher than the first temperature to join the superposed substrate in a joint unit having an atmosphere therein set at a predetermined degree of vacuum; and a post-thermal processing step of then mounting the superposed substrate on a third thermal processing plate and cooling the superposed substrate down to a third temperature lower than the second temperature in a post-thermal processing unit, wherein during a time when performing the joint step on one superposed substrate, the pre-thermal processing step or the post-thermal processing step is performed on another superposed substrate.

The present invention according to still another aspect is a computer-readable storage medium having a program stored therein, the program running on a computer of a control unit controlling the joint apparatus to cause the joint apparatus to execute the joint method.

Effect of the Invention

According to the present invention, it is possible to efficiently perform joint of substrates having metal joint portions to improve the throughput of substrate joint processing.

EMBODIMENT FOR CARRYING OUT THE INVENTION

Figure 1:
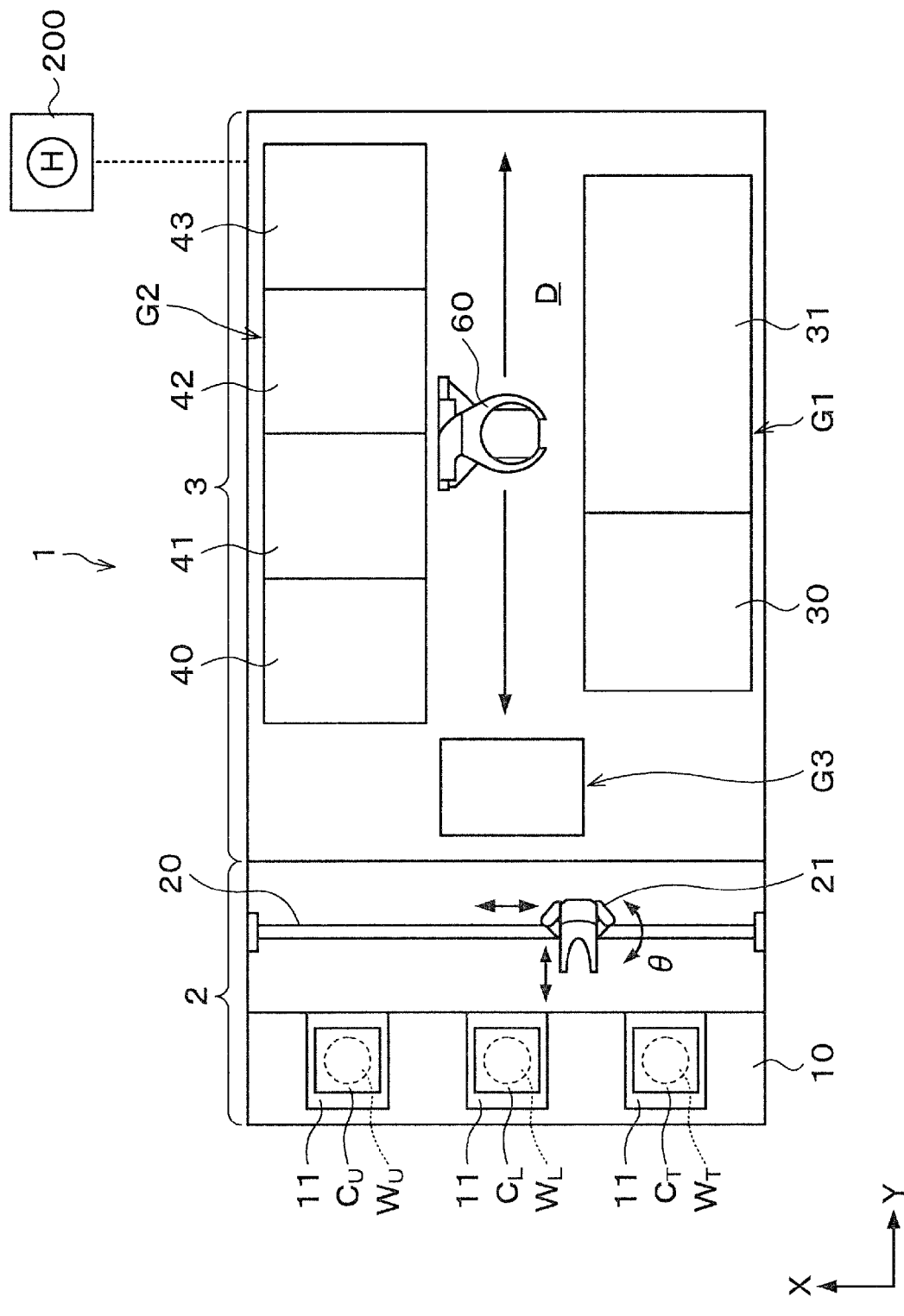
FIG. 1 A plan view illustrating the outline of the configuration of a joint system having a joint apparatus according to this embodiment.
Figure 2:
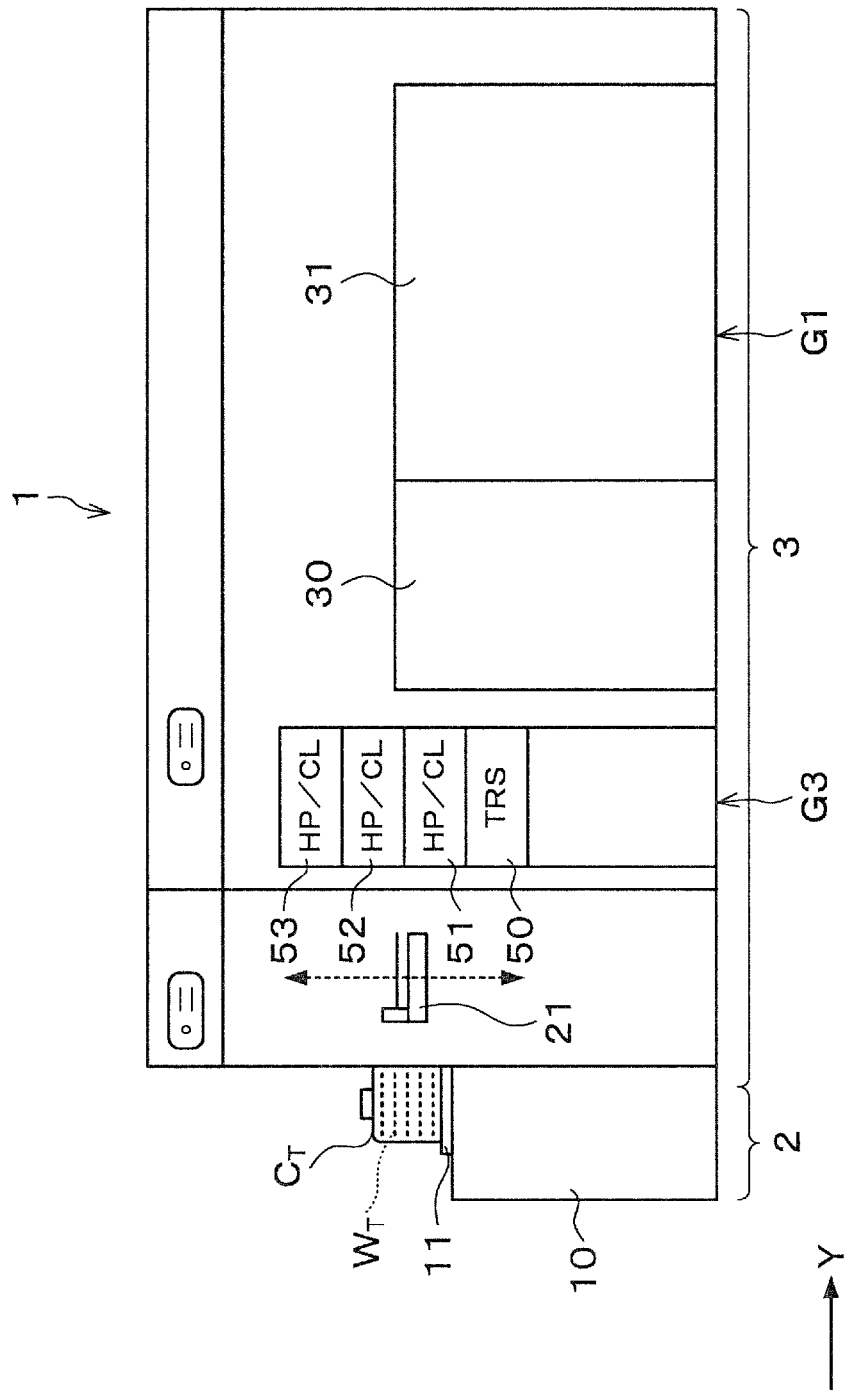
FIG. 2 A side view illustrating the outline of the internal configuration of the joint system according to this embodiment.

Hereinafter, an embodiment of the present invention will be described. FIG. 1 is a plan view illustrating the outline of the configuration of a joint system 1 having a joint apparatus according to this embodiment. FIG. 2 is a side view illustrating the outline of the internal configuration of the joint system 1.

Figure 3:
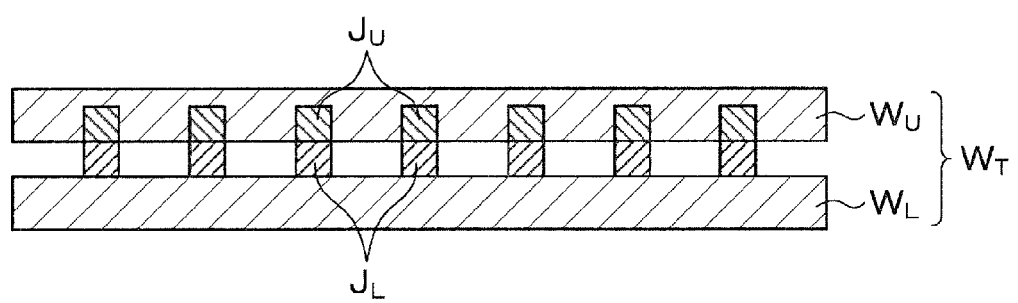
FIG. 3 A cross-sectional view of a superposed wafer.

In the joint system 1, for example, wafers $W_U$, $W_L$ as two substrates are joined together as illustrated in FIG. 3. Hereinafter, the wafer located on the upper side may be referred to as an "upper wafer $W_U$," and the wafer located on the lower side may be referred to as a "lower wafer $W_L$." Each of the wafers $W_U$, $W_L$ has a plurality of metal joint portions $J_U$, $J_L$ respectively. The wafers $W_U$, $W_L$ are superposed on each other with the joint portions $J_U$, $J_L$ in abutment with each other to form a superposed wafer $W_T$ as a superposed substrate, and the wafers $W_U$, $W_L$ are joined together. Note that in this embodiment, aluminum is used for the joint portions $J_U$, and germanium is used for the joint portions $J_L$ for instance.

The joint system 1 has the configuration in which a cassette station 2 to/from which cassettes $C_U$, $C_L$, $C_T$ capable of housing a plurality of wafers $W_U$, $W_L$ and superposed wafers $W_T$ respectively are transferred from/to the outside, and a processing station 3 including various kinds of processing apparatuses performing predetermined processing on the wafers $W_U$, $W_L$ and superposed wafers $W_T$, are integrally connected as illustrated in FIG. 1.

In the cassette station 2, a cassette mounting table 10 is provided. On the cassette mounting table 10, a plurality of, for example, three cassette mounting plates 11 are provided. The cassette mounting plates 11 are arranged side by side in a line in an X-direction being the horizontal direction (a top-down direction in FIG. 1). On the cassette mounting plates 11, the cassettes $C_U$, $C_L$, $C_T$ can be mounted when the cassettes $C_U$, $C_L$, $C_T$ are transferred from/to the outside of the joint system 1.

In the cassette station 2, a wafer transfer apparatus 21 movable on a transfer path 20 extending in the X-direction is provided as illustrated in FIG. 1. The wafer transfer apparatus 21 is movable also in the vertical direction and around the vertical axis (in a θ-direction) and thus can transfer the wafers $W_U$, $W_L$ and the superposed wafers $W_T$ between the cassettes $C_U$, $C_L$, $C_T$ on the cassette mounting plates 11 and a later-described delivery apparatus in a third block G3 in the processing station 3.

In the processing station 3, a plurality of, for example, three blocks G1, G2, G3 each including various kinds of apparatuses are provided. For example, the first block G1 is provided, for example, on the front side in the processing station 3 (on an X-direction negative direction side in FIG. 1), and the second block G2 is provided on the back side in the processing station 3 (on an X-direction positive direction side in FIG. 1). Further, the third block G3 is provided on the cassette station 2 side in the processing station 3 (on a Y-direction negative direction side in FIG. 1).

For example, in the first block G1, a cleaning apparatus 30 cleaning the front surfaces of the wafers $W_U$, $W_L$ with a cleaning solution such as, for example, pure water, and an alignment apparatus 31 aligning and superposing the wafers $W_U$, $W_L$, and temporarily joining them together to form the superposed wafer $W_T$, are arranged in this order from the cassette station 2 side.

For example, in the second block G2, a plurality of, for example, four joint apparatuses 40 to 43 are provided each of which joins the superposed wafer $W_T$. The joint apparatuses 40 to 43 are arranged side by side in a line in the Y-direction (in a right-left direction in FIG. 1) being the horizontal direction.

For example, in the third processing block G3, a transition apparatus 50 for the wafers $W_U$, $W_L$ and the superposed wafer $W_T$ and thermal processing apparatuses 51 to 53 each performing thermal processing on the wafers $W_U$, $W_L$ and the superposed wafer $W_T$ are provided at four tiers in order from the bottom as illustrated in FIG. 2.

In an area surrounded by the first block G1 to the third block G3, a wafer transfer area D is formed as illustrated in FIG. 1. In the wafer transfer area D, for example, a wafer transfer apparatus 60 is disposed.

The wafer transfer apparatus 60 has a transfer arm movable, for example, in the Y-direction, the X-direction, the θ-direction and the vertical direction. The wafer transfer apparatus 60 can move in the wafer transfer area D to transfer the wafers $W_U$, $W_L$ and the superposed wafer $W_T$ to a predetermined apparatus in the first block G1, the second block G2 and the third block G3 therearound.

Figure 4:
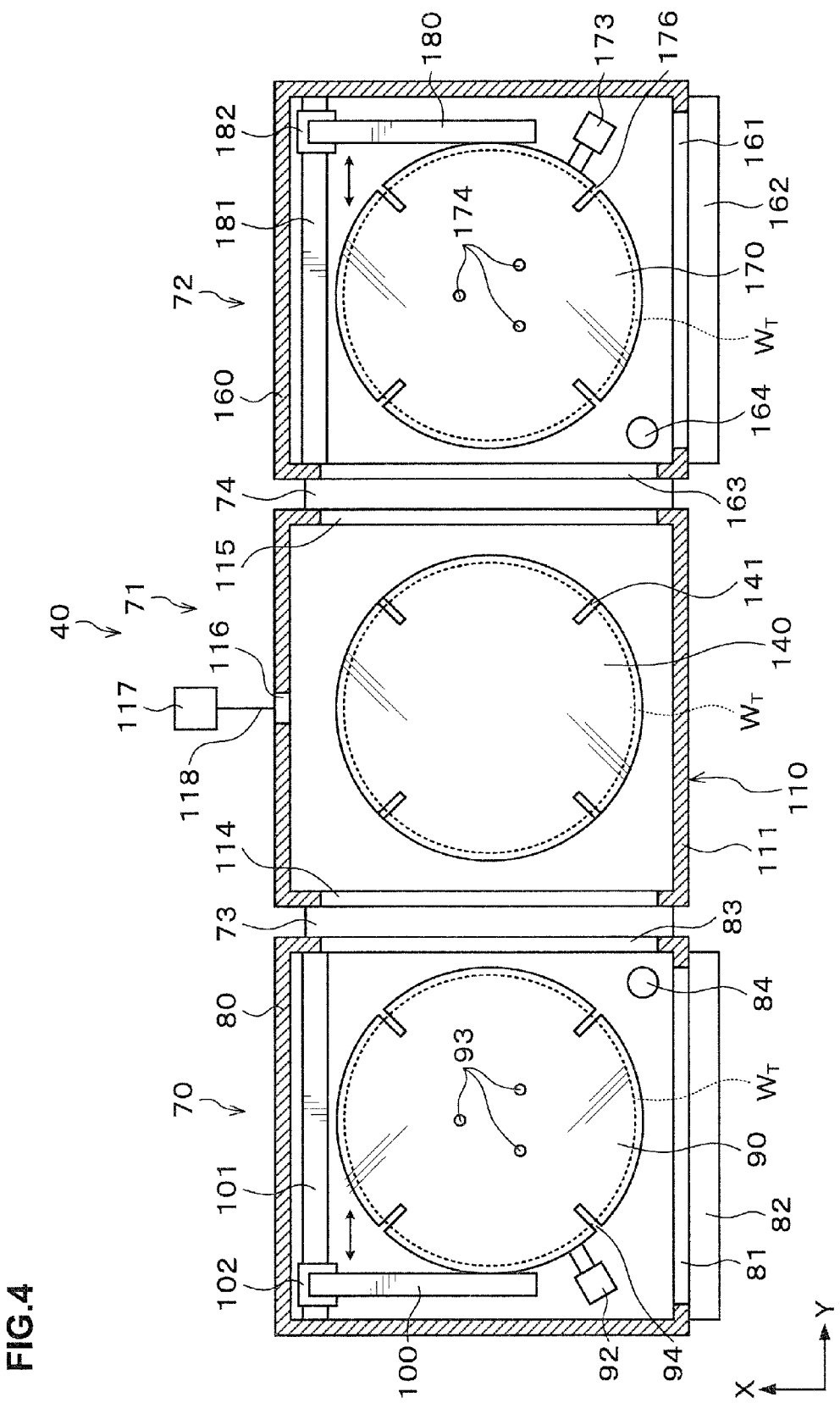
FIG. 4. A transverse sectional view illustrating the outline of the configuration of the joint apparatus.
Figure 5:
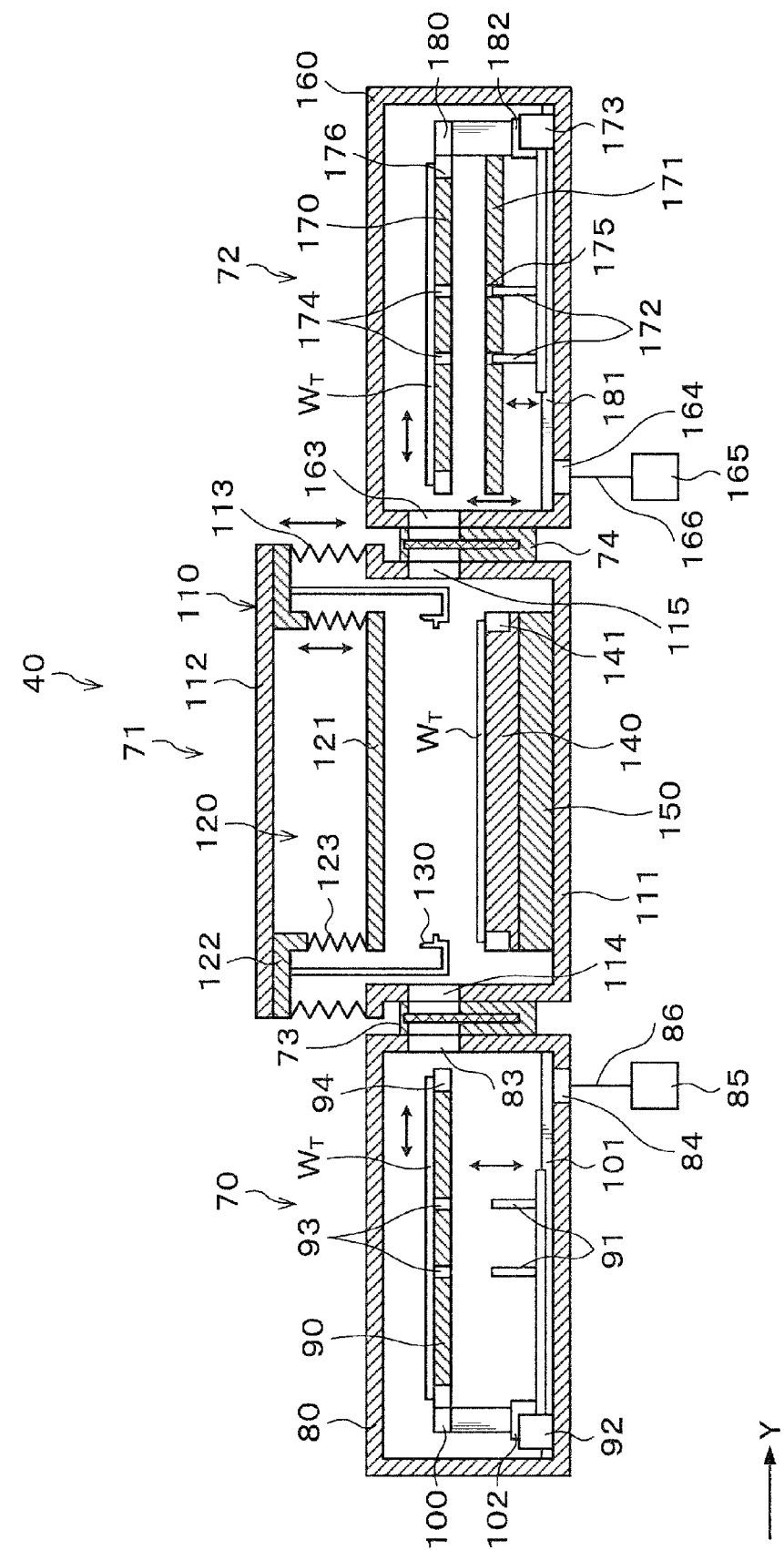
FIG. 5 A longitudinal sectional view illustrating the outline of the configuration of the joint apparatus.

Next, the configurations of the above-described joint apparatuses 40 to 43 will be described. The joint apparatus 40 has the configuration in which a pre-thermal processing unit 70, a joint unit 71, and a post-thermal processing unit 72 are arranged side by side in this order in the Y-direction (in a right-left direction in FIG. 4 and FIG. 5) being the horizontal direction and integrally connected as illustrated in FIG. 4 and FIG. 5. More specifically, the pre-thermal processing unit 70 and the post-thermal processing unit 72 are hermetically connected to the joint unit 71 via gate valves 73, 74 respectively.

The pre-thermal processing unit 70 has a processing container 80 which can hermetically close the inside. A transfer-in/out port 81 for the superposed wafer $W_T$ is formed in a side surface on the wafer transfer area D side of the processing container 80, and a gate valve 82 is provided at the transfer-in/out port 81. Further, a transfer-in/out port 83 for the superposed wafer $W_T$ is formed in a side surface on the joint unit 71 side of the processing container 80, and the above-described gate valve 73 is provided at the transfer-in/out port 83.

An intake port 84 is formed in the bottom surface of the processing container 80. To the intake port 84, an intake pipe 86 is connected which communicates with a vacuum pump 85 reducing the atmosphere inside the processing container 80 down to a predetermined degree of vacuum. Note that in this embodiment, the intake port 84, the vacuum pump 85, and the intake pipe 86 constitute a first pressure reducing mechanism.

Inside the processing container 80, a first thermal processing plate 90 is provided which mounts and thermally processes the superposed wafer $W_T$ thereon. In the first thermal processing plate 90, a heater (not illustrated) generating heat, for example, by power feeding is embedded. The heating temperature by the first thermal processing plate 90 is controlled, for example, by a later-described control unit 200.

Below the first thermal processing plate 90, for example, three raising and lowering pins 91 are provided for supporting the superposed wafer $W_T$ from below and raising and lowering the superposed wafer $W_T$. The raising and lowering pins 91 can move up and down by means of a raising and lowering drive part 92. Near the center portion of the first thermal processing plate 90, through holes 93 penetrating the first thermal processing plate 90 in the thickness direction are formed, for example, at three positions. The raising and lowering pins 91 are inserted into the through holes 93 to be able to project from the upper surface of the first thermal processing plate 90. Further, at the outer peripheral portion of the first thermal processing plate 90, cutout portions 94 for allowing later-described holding parts 132 of holding arms 130 to pass through are formed, for example, at four positions.

The first thermal processing plate 90 is supported by a supporting member 100. At the base end portion of the supporting member 100, a drive part 102 is attached which is movable on a rail 101 extending in the Y-direction. By means of the drive part 102, the first thermal processing plate 90 is movable between the pre-thermal processing unit 70 and the joint unit 71. Note that in this embodiment, the supporting member 100, the rail 101, and the drive part 102 constitute a moving mechanism.

The joint unit 71 has a processing container 110 capable of hermetically closing the inside. The processing container 110 has the configuration in which a container body 111 and a ceiling plate 112 are connected by a shield bellows 113. The shield bellows 113 is configured to be capable of expanding and contracting in the vertical direction, and allows the ceiling plate 112 to be movable in the vertical direction.

A transfer-in/out port 114 for the superposed wafer $W_T$ is formed in a side surface on the pre-thermal processing unit 70 side of the container body 111, and the above-described gate valve 73 is provided at the transfer-in/out port 114. Further, a transfer-in/out port 115 for the superposed wafer $W_T$ is formed in a side surface on the post-thermal processing unit 72 side of the container body 111, and the above-described gate valve 74 is provided at the transfer-in/out port 115.

An intake port 116 is formed in a side surface of the container body 111. To the intake port 116, an intake pipe 118 is connected which communicates with a vacuum pump 117 reducing the atmosphere inside the processing container 110 down to a predetermined degree of vacuum. Note that in this embodiment, the intake port 116, the vacuum pump 117, and the intake pipe 118 constitute a second pressure reducing mechanism.

Inside the processing container 110 and at the ceiling plate 112, a pressurizing mechanism 120 is provided which presses the superposed wafer $W_T$ on a later-described second thermal processing plate 140 toward the second thermal processing plate 140 side. The pressurizing mechanism 120 has a pressing member 121 coming into contact with and pressing the superposed wafer $W_T$, a supporting member 122 annually attached to the ceiling plate 112, and a pressurizing bellows 123 connecting the pressing member 121 and the supporting member 122 and capable of expanding and contracting in the vertical direction. Inside the pressing member 121, for example, a heater (not illustrated) generating heat, for example, by power feeding is embedded. For example, compressed air is supplied or sucked to/from the inside of the pressurizing mechanism 120, that is, the internal space surrounded by the pressing member 121, the pressurizing bellows 123, the supporting member 122, and the ceiling plate 112, whereby the pressurizing bellows 123 expands and contracts to allow the pressing member 121 to be movable in the vertical direction. Note that since the compressed air is sealed inside the pressurizing mechanism 120, the stiffness of the pressurizing bellows 123 of the pressurizing mechanism 120 is greater than the stiffness of the shield bellows 113 of the processing container 110 in order to stand the internal pressure by the compressed air.

Further, the holding arms 130 for delivering the superposed wafer $W_T$ between the first thermal processing plate 90 or a later-described third processing plate 170 and the second thermal processing plate 140 are provided inside the processing container 110 and at the ceiling plate 112. Accordingly, the holding arms 130 are movable in the vertical direction with the movement of the ceiling plate 112. Four holding arms 130 are provided at regular intervals, for example, on the same circumference of the superposed wafer $W_T$ to hold the peripheral portion of the superposed wafer $W_T$ at four positions. The holding arm 130 has a supporting part 131 extending downward in the vertical direction from the ceiling plate 112 with a lower end portion bending and extending inward in the horizontal direction, and a holding part 132 supported by the supporting portion 131 and holding the superposed wafer $W_T$. The holding part 132 has a projecting member 133 projecting inward in the horizontal direction and holding the lower surface of the outer peripheral portion of the superposed wafer $W_T$, and a guide member 134 extending upward in the vertical direction from the projecting member 133 and guiding the outer peripheral portion side surface of the superposed wafer $W_T$. Further, the inner side surface at the upper end of the guide member 134 expands in a tapered shape from the lower side to the upper side.

Figure 6:
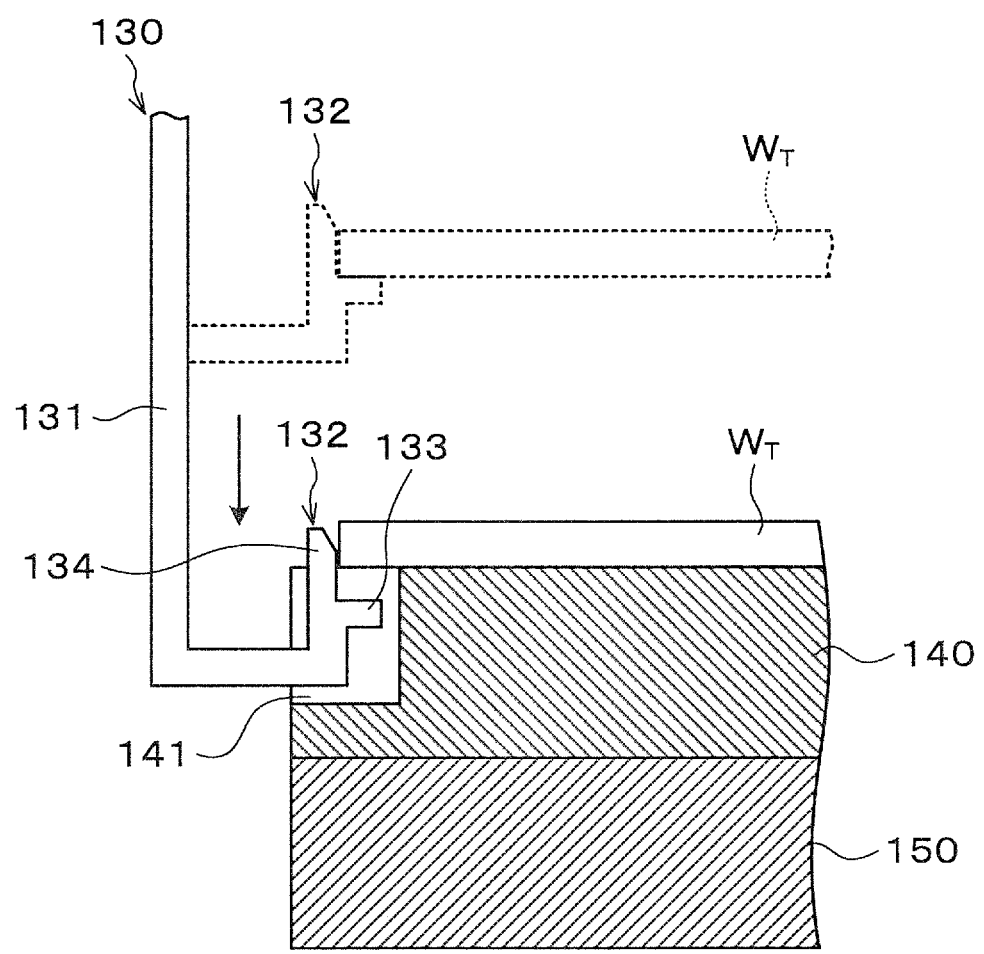
FIG. 6 An explanatory view illustrating an appearance in which a holding part of a holding arm is housed in a second thermal processing plate and the superposed wafer is mounted on the second thermal processing plate.

As illustrated in FIG. 5, inside the processing container 110 and below the pressurizing mechanism 120, the second thermal processing plate 140 which mounts and thermally processing the superposed wafer $W_T$ thereon is provided at a position opposing the pressurizing mechanism 120. In the second thermal processing plate 140, for example, a heater (not illustrated) generating heat, for example, by power feeding is embedded. The heating temperature by the second thermal processing plate 140 is controlled, for example, by the later-described control unit 200. Further, a cutout groove 141 for housing the holding part 132 of the holding arm 130 with the superposed wafer $W_T$ delivered from the holding arm 130 to the second thermal processing plate 140 is formed at the outer peripheral portion of the second thermal processing plate 140 as illustrated in FIG. 6. The cutout grooves 141 are formed, for example, at four positions at the outer peripheral portion of the second thermal processing plate 140 as illustrated in FIG. 4.

As illustrated in FIG. 5, a cooling plate 150 for cooling the superposed wafer $W_T$ is provided on the lower surface side of the second thermal processing plate 140. A cooling member (not illustrated) such as a Peltier element or a water-cooled jacket is embedded in the cooling plate 150. The cooling temperature by the cooling plate 150 is controlled, for example, by the later-described control unit 200.

The post-thermal processing unit 72 has almost the same configuration as that of the pre-thermal processing unit 70. More specifically, the post-thermal processing unit 72 has a processing container 160 capable of hermetically closing the inside as illustrated in FIG. 4 and FIG. 5. A transfer-in/out port 161 for the superposed wafer $W_T$ is formed in a side surface on the wafer transfer area D side of the processing container 160, and a gate valve 162 is provided at the transfer-in/out port 161. Further, a transfer-in/out port 163 for the superposed wafer $W_T$ is formed in a side surface on the joint unit 71 side of the processing container 160, and the above-described gate valve 74 is provided at the transfer-in/out port 163.

An intake port 164 is formed in the bottom surface of the processing container 160. To the intake port 164, an intake pipe 166 is connected which communicates with a vacuum pump 165 reducing the atmosphere inside the processing container 160 down to a predetermined degree of vacuum. Note that in this embodiment, the intake port 164, the vacuum pump 165, and the intake pipe 166 constitute a third pressure reducing mechanism.

Inside the processing container 160, a third thermal processing plate 170 is provided which mounts and thermally processing the superposed wafer $W_T$ thereon. In the third thermal processing plate 170, a heater (not illustrated) generating heat, for example, by power feeding is embedded. The heating temperature by the third thermal processing plate 170 is controlled, for example, by the later-described control unit 200.

Below the third thermal processing plate 170, a cooling plate 171 for cooling the superposed wafer $W_T$ is provided. A cooling member (not illustrated) such as a Peltier element or a water-cooled jacket is embedded in the cooling plate 171. The cooling temperature by the cooling plate 171 is controlled, for example, by the later-described control unit 200. Further, the cooling plate 171 is configured to be movable up and down by means of a raising and lowering drive part (not illustrated).

Below the third thermal processing plate 170 and the cooling plate 171, for example, three raising and lowering pins 172 are provided for supporting the superposed wafer $W_T$ from below and raising and lowering the superposed wafer $W_T$. The raising and lowering pins 172 can move up and down by means of a raising and lowering drive part 173. Near the center portion of the third thermal processing plate 170, through holes 174 penetrating the third thermal processing plate 170 in the thickness direction are formed, for example, at three positions. Also near the center portion of the cooling plate 171, through holes 175 penetrating the cooling plate 171 in the thickness direction are formed, for example, at three positions. The raising and lowering pins 172 are inserted into the through holes 174, 175 to be able to project from the upper surface of the third thermal processing plate 170. Further, at the outer peripheral portion of the third thermal processing plate 170, cutout portions 176 for allowing the holding parts 132 of the holding arms 130 to pass through are formed, for example, at four positions.

Figure 7:
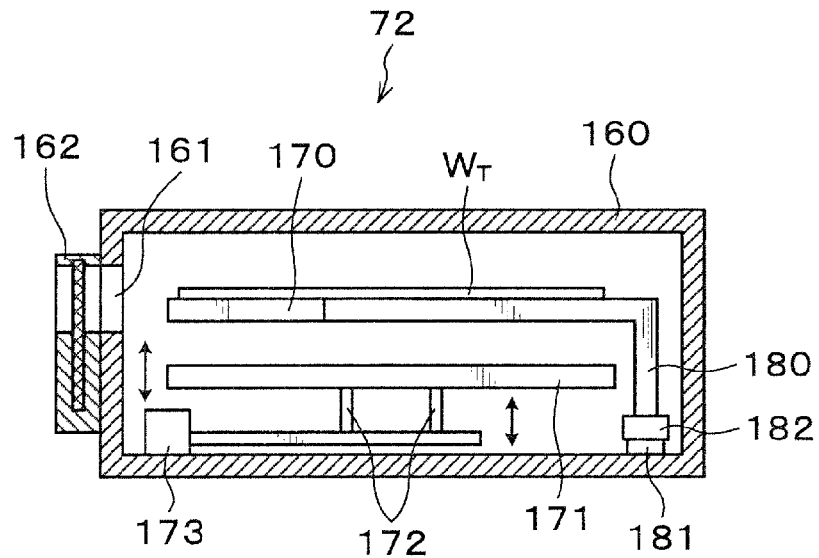
FIG. 7 A longitudinal sectional view illustrating the outline of the configuration of a post-thermal processing unit.

The third thermal processing plate 170 is supported by a supporting member 180. At the base end portion of the supporting member 180, a drive part 182 is attached which is movable on a rail 181 extending in the Y-direction. By means of the drive part 182, the third thermal processing plate 170 is movable between the post-thermal processing unit 72 and the joint unit 71. Note that in this embodiment, the supporting member 180, the rail 181, and the drive part 182 constitute a moving mechanism. Further, the supporting member 180 extends in the vertical direction from the drive part 182 in a manner not to interfere with the cooling plate 171 and its upper end portion bends and extends in the horizontal direction as illustrated in FIG. 7.

Note that the configurations of the joint apparatuses 41 to 43 are the same as the configuration of the above-described joint apparatus 40 and their description will be omitted.

In the foregoing joint system 1, the control unit 200 is provided as illustrated in FIG. 1. The control unit 200 is, for example, a computer and has a program storage part (not illustrated). In the program storage part, a program is stored which controls the processing on the superposed wafer $W_T$ in the joint apparatuses 40 to 43. Further, a program controlling operations of the above-described various kinds of processing apparatuses and the drive system such as the transfer apparatuses to realize later-described joint processing in the joint system 1 is also stored in the program storage part. Note that the programs may be the ones which are recorded, for example, in a computer-readable storage medium H such as a computer-readable hard disk (HD), flexible disk (FD), compact disk (CD), magneto-optical disk (MO), memory card and installed from the storage medium H to the control unit 200.

Figure 8:
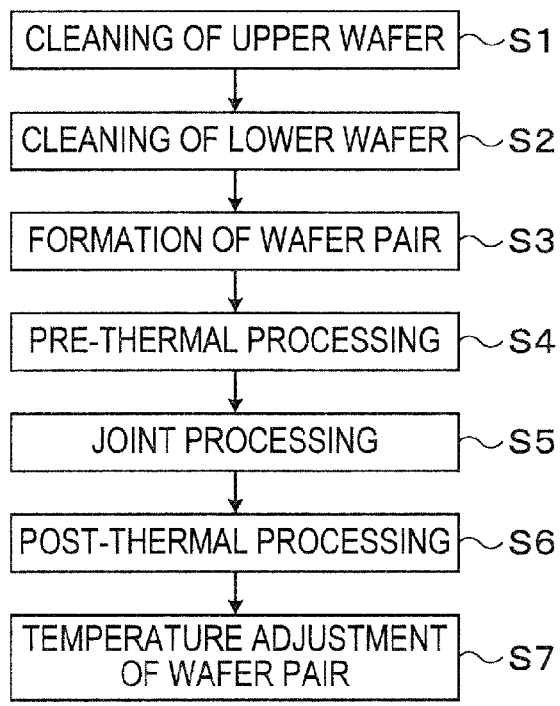
FIG. 8 A flowchart illustrating main steps of wafer joint processing.

Next, a joint processing method for the superposed wafer $W_T$ performed using the joint system 1 configured as described above will be described. FIG. 8 is a flowchart illustrating an example of main steps of the wafer joint processing.

First, a cassette $C_U$ housing a plurality of upper wafers $W_U$, a cassette $C_L$ housing lower wafers $W_L$, and a vacant cassette $C_T$ are mounted on the predetermined cassette mounting plates 11 in the cassette station 2. Then, an upper wafer $W_U$ in the cassette $C_U$ is taken out by the wafer transfer apparatus 21 and transferred to, for example, the transition apparatus 50 in the third block G3 in the processing station 3.

Then, the upper wafer $W_U$ is transferred by the wafer transfer apparatus 60 to the cleaning apparatus 30 in the first block G1, and the front surface of the upper wafer $W_U$ is cleaned with the cleaning solution (Step S1 in FIG. 8). The upper wafer $W_U$ is then transferred by the wafer transfer apparatus 60 to the alignment apparatus 31.

Subsequent to the upper wafer $W_U$, a lower wafer $W_L$ in the cassette $C_L$ is taken out by the wafer transfer apparatus 21 and transferred to the transition apparatus 50. Then, the lower wafer $W_L$ is transferred by the wafer transfer apparatus 60 to the cleaning apparatus 30, and the front surface of the lower wafer $W_L$ is cleaned with the cleaning solution (Step S2 in FIG. 8). The lower wafer $W_L$ is then transferred by the wafer transfer apparatus 60 to the alignment apparatus 31.

After the upper wafer $W_U$ and the lower wafer $W_L$ are transferred to the alignment apparatus 31, the wafers $W_U$, $W_L$ are aligned and superposed. Note that one or both of the wafers $W_U$, $W_L$ are previously coated with, for example, an adhesive before they are superposed on each other, and are bonded together at the time of superposition and thereby temporarily joined together to form a superposed wafer $W_T$ (Step S3 in FIG. 8).

Figure 9:
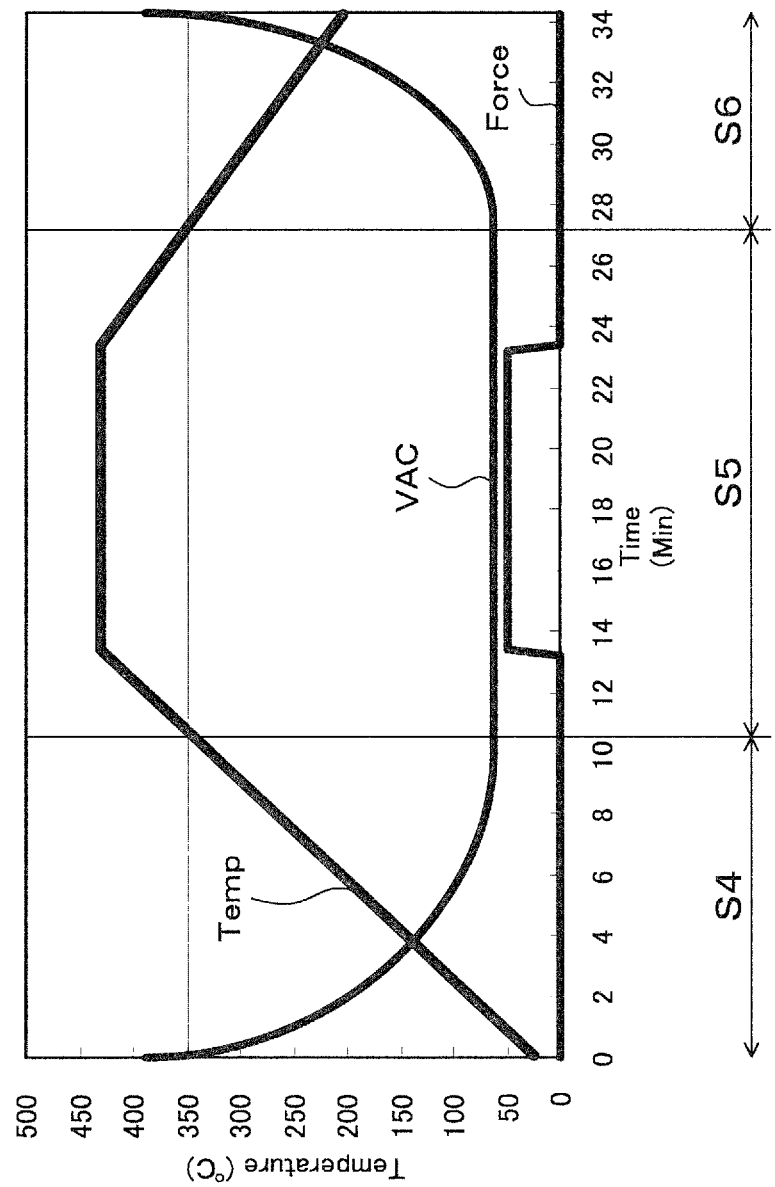
FIG. 9 A graph showing temporal changes in the temperature of the superposed wafer, the load to be applied on the superposed wafer, and the pressure of the atmosphere in each unit in the joint apparatus.

The superposed wafer $W_T$ is then transferred by the wafer transfer apparatus 60 to the joint apparatus 40 in the second block G2. FIG. 9 shows temporal changes in the temperature of the superposed wafer $W_T$ ("Temp" in FIG. 9), the load to be applied on the superposed wafer $W_T$ ("Force" in FIG. 9), and the pressure of the atmosphere in each unit 70, 71, 72 ("VAC" in FIG. 9) in the joint apparatus 40.

In the joint apparatus 40, the gate valve 82 of the pre-thermal processing unit 70 is opened first, and the superposed wafer $W_T$ is then transferred thereinto to above the first thermal processing plate 90 by the wafer transfer apparatus 60. Subsequently, the raising and lowering pins 91 are raised and the superposed wafer $W_T$ is delivered from the wafer transfer apparatus 60 to the raising and lowering pins 91, and the raising and lowering pins 91 are then lowered to mount the superposed wafer $W_T$ on the first thermal processing plate 90. In this event, the gate valve 82 is closed and the pressure of the atmosphere inside the processing container 80 is reduced by the vacuum pump 85. Thereafter, the superposed wafer $W_T$ is heated by the first thermal processing plate 90 up to a first temperature, for example, 350° C. (Step S4 in FIG. 8). In this event, the heating is performed at a predetermined heating rate, for example, a heating rate of 10 to 50° C./min in order to uniformly heat the joint portions $J_U$, $J_L$ of the superposed wafer $W_T$. Further, the pressure inside the pre-thermal processing unit 70 is reduced down to the pressure inside the joint unit 71.

After the superposed wafer $W_T$ is heated up to the first temperature, the gate valve 73 is opened. Subsequently, the first thermal processing plate 90 on which the superposed wafer $W_T$ is mounted is moved by the drive part 102 to the joint unit 71, and the superposed wafer $W_T$ is transferred to above the second thermal processing plate 140. In this event, the holding arms 130 are waiting below the first thermal processing plate 90.

Note that the superposed wafer $W_T$ may be heated during the time when the superposed wafer $W_T$ is being transferred by the first thermal processing plate 90 from the pre-thermal processing unit 70 to the joint unit 71.

Figure 10:
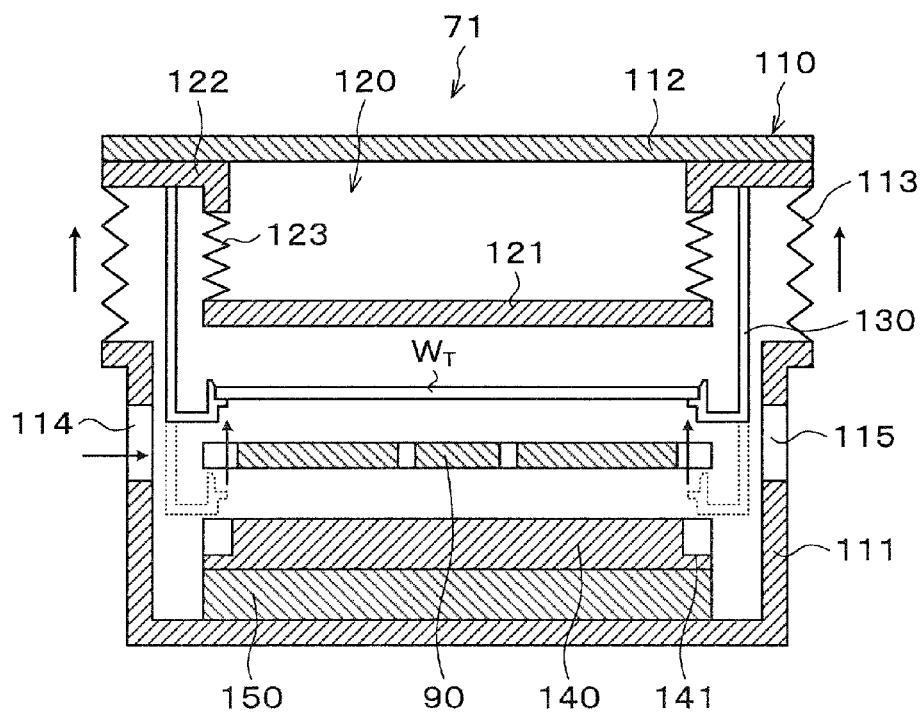
FIG. 10 An explanatory view illustrating an appearance in which the superposed wafer is delivered from a first thermal processing plate to the holding arms.

Thereafter, the holding arms 130 are raised as illustrated in FIG. 10 and the holding arms 130 pass through the cutout portions 94 of the first thermal processing plate 90, and the superposed wafer $W_T$ is delivered from the first processing plate 90 to the holding parts 132 of the holding arms 130. Since the inner side surfaces at the upper ends of the guide members 134 of the holding parts 132 expand in a tapered shape from the lower side to the upper side, the superposed wafer $W_T$ is smoothly held by the guide members 134 in this event even if the superposed wafer $W_T$ on the first thermal processing plate 90 is located, for example, displaced from the inner side surfaces of the guide members 134. Then, the first thermal processing plate 90 is moved to the pre-thermal processing unit 70 and the gate valve 73 is closed.

Figure 11:
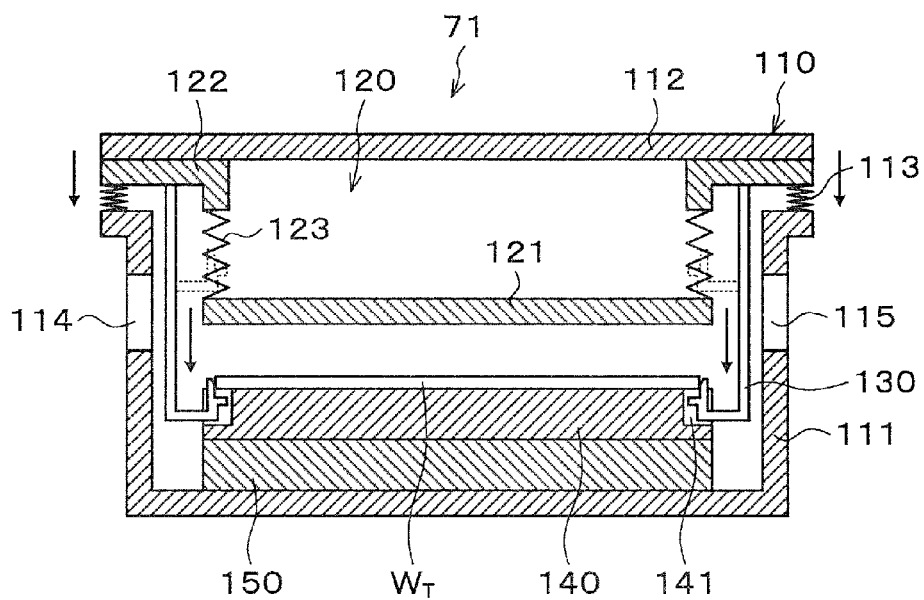
FIG. 11 An explanatory view illustrating an appearance in which the superposed wafer is mounted from the holding arms to the second thermal processing plate.

Then, the holding arms 130 are lowered as illustrated in FIG. 11 to mount the superposed wafer $W_T$ on the second thermal processing plate 140. In this event, the holding parts 132 of the holding arms 130 are housed in the cutout grooves 141 of the second thermal processing plate 140.

Then, the superposed wafer $W_T$ is heated by the first thermal processing plate 90 up to a second temperature, for example, 430° C. The superposed wafer $W_T$ is heated at a predetermined heating rate, for example, 10 to 50° C./min. Note that the atmosphere inside the processing container 110 is maintained at a predetermined degree of vacuum, for example, a degree of vacuum of 0.1 Pa.

Figure 12:
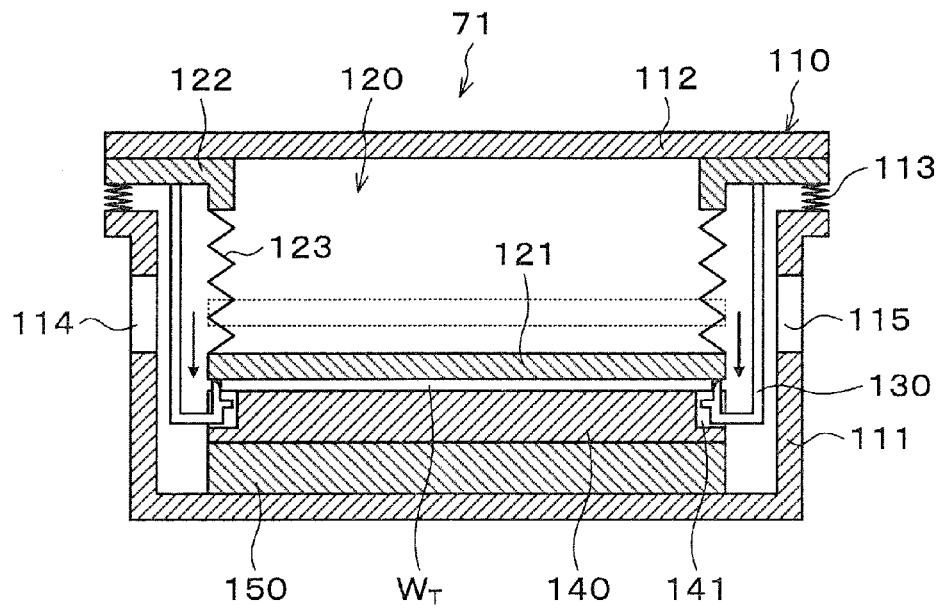
FIG. 12 An explanatory view illustrating an appearance in which the superposed wafer on the second thermal processing plate is pressed and joined.

Thereafter, the compressed air is supplied to the pressurizing mechanism 120 to lower the pressing member 121 as illustrated in FIG. 12 while the temperature of the superposed wafer $W_T$ is maintained at the second temperature. Then, the pressing member 121 is brought into contact with the superposed wafer $W_T$ and presses the superposed wafer $W_T$ toward the second thermal processing plate 140 side at a predetermined load, for example, 50 kN. Then, the superposed wafer $W_T$ is pressed for a predetermined time, for example, 10 minutes, so that the superposed wafer $W_T$ is joined (Step S5 in FIG. 8). Note that the temperature of the superposed wafer $W_T$ may be maintained at the second temperature, for example, using the heater inside the pressing member 121 or the cooling plate 150.

Then, the superposed wafer $W_T$ is cooled down to, for example, 350° C. by the second thermal processing plate 140. The cooling is performed on the superposed wafer $W_T$ at a predetermined cooling rate, for example, a cooling rate of 10 to 50° C./min in order to prevent change in strength and physical property of the joint portions $J_U$, $J_L$. Note that the cooling of the superposed wafer $W_T$ may be performed, for example, by decreasing the temperature of the heater inside the pressing member 121 or using the cooling plate 150.

Figure 13:
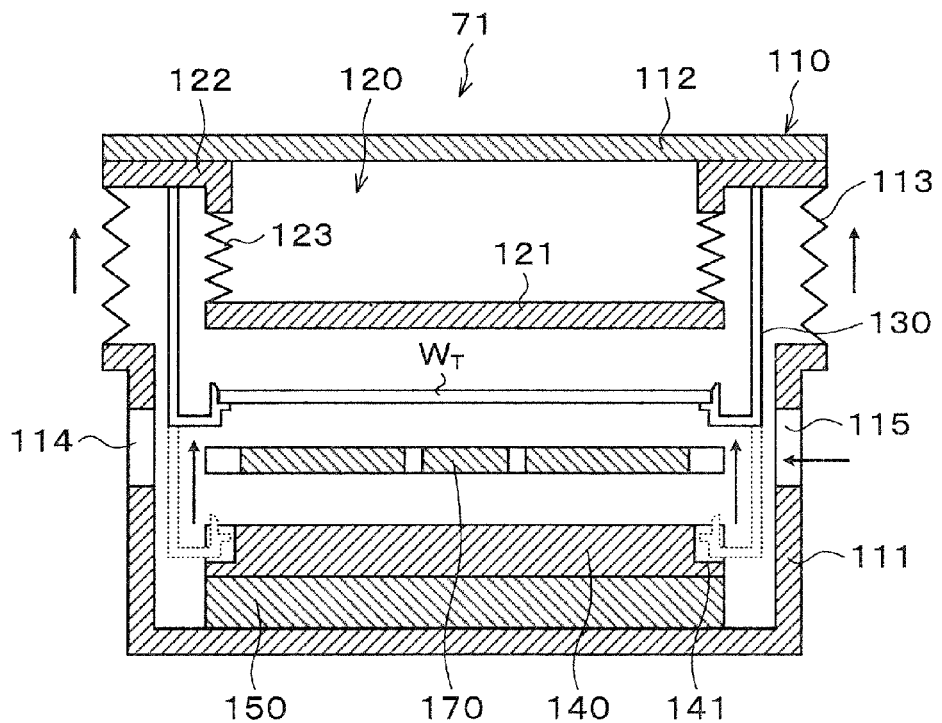
FIG. 13 An explanatory view illustrating an appearance in which the superposed wafer is delivered from the second thermal processing plate to the holding arms.

After the superposed wafer $W_T$ is cooled down to 350° C., the holding arms 130 are raised, and the superposed wafer $W_T$ is delivered from the second thermal processing plate 140 to the holding arms 130 as illustrated in FIG. 13. Subsequently, the holding arms 130 are further raised and the gate valve 74 is opened. Then, the third thermal processing plate 170 in the post-thermal processing unit 72 is moved by the drive part 182 to below the holding aims 130 and above the second thermal processing plate 140. Note that the pressure inside the post-thermal processing unit 72 is previously reduced to the pressure inside the joint unit 71.

Figure 14:
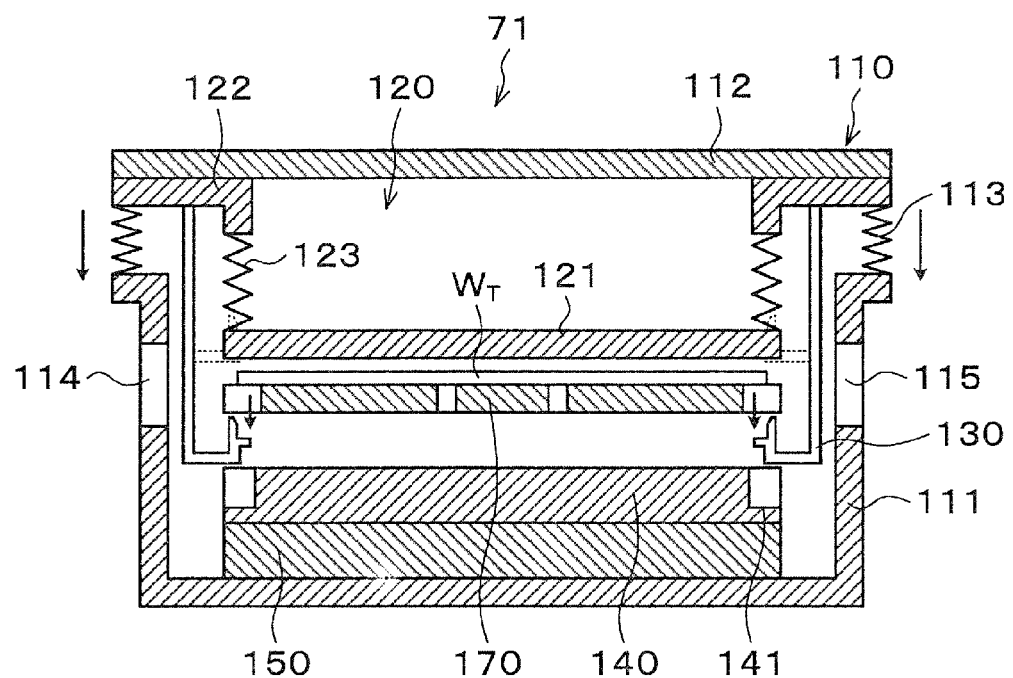
FIG. 14 An explanatory view illustrating an appearance in which the superposed wafer is delivered from the holding arms to a third thermal processing plate.

Thereafter, the holding arms 130 are lowered and pass through the cutout portions 176 of the third thermal processing plate 170 to mount the superposed wafer $W_T$ on the third thermal processing plate 170 as illustrated in FIG. 14.

Then, the third thermal processing plate 170 is moved to the post-thermal processing unit 72 and the gate valve 74 is closed. Then, the superposed wafer $W_T$ is cooled by the third thermal processing plate 170 down to a third temperature, for example, 200° C. (Step S6 in FIG. 8). In this event, the superposed wafer $W_T$ may be cooled by the cooling plate 171 which is raised until the cooling plate 171 is brought into contact with the third thermal processing plate 170.

Note that the superposed wafer $W_T$ may be cooled during the time when the superposed wafer $W_T$ is being transferred by the third thermal processing plate 170 from the joint unit 71 to the post-thermal processing unit 72.

Thereafter, the pressure inside the post-thermal processing unit 72 is opened up to the atmospheric pressure, the raising and lowering pins 172 are raised, and the superposed wafer $W_T$ is delivered from the third thermal processing plate 170 to the raising and lowering pins 172. Subsequently, the gate valve 162 is opened, and the superposed wafer $W_T$ is delivered from the raising and lowering pins 172 to the wafer transfer apparatus 60 and transferred out of the joint apparatus 40.

Thereafter, the superposed wafer $W_T$ is transferred by the wafer transfer apparatus 60 to the thermal processing apparatus 51 in the third block G3 and temperature adjusted to a predetermined temperature (Step S7 in FIG. 8). The superposed wafer $W_T$ is then transferred by the wafer transfer apparatus 60 to the transition apparatus 50 and then transferred by the wafer transfer apparatus 21 in the cassette station 2 to the cassette $C_T$ on the predetermined cassette mounting plate 11. Thus, a series of joint processing for the superposed wafer $W_T$ ends.

Note that in the joint apparatus 40, during the time when the joint processing at Step S5 is being performed on one superposed wafer $W_T$ in the joint unit 71, the pre-thermal processing at Step S4 may be performed on another superposed wafer $W_T$ in the pre-thermal processing unit 70. Further, the post-thermal processing at Step S6 may be performed on another superposed wafer $W_T$ also in the post-thermal processing unit 72 in this event. In other words, processing is performed on two or three superposed wafers $W_T$ in parallel in one joint apparatus 40.

According to the joint apparatus 40 in the above embodiment, the superposed wafers $W_T$ can be sequentially processed in the pre-thermal processing unit 70, the joint unit 71, and the post-thermal processing unit 72. More specifically, first, at Step S4 performed in the pre-thermal processing unit 70, the superposed wafer $W_T$ is mounted on the first thermal processing plate 90 and heated to the first temperature. Then, at Step S5 performed in the joint unit 71, while the superposed wafer $W_T$ is mounted on the second thermal processing plate 140 and maintained at the second temperature being the predetermined temperature, the pressurizing mechanism 120 presses the superposed wafer $W_T$ toward the second thermal processing plate 140 side to join the superposed wafer $W_T$. Thereafter, at Step S6 performed in the post-thermal processing unit 72, the superposed wafer $W_T$ is mounted and cooled on the third thermal processing plate 170. Then, during the time when one superposed wafer $W_T$ is being processed in the joint unit 71, another superposed wafer $W_T$ can be processed in parallel at least in the pre-thermal processing unit 70 or the post-thermal processing unit 72. According to this embodiment, processing can be simultaneously and efficiently performed on two or three superposed wafers $W_T$ even if the second temperature is high, so that the throughput of the wafer joint processing can be improved.

Further, since the heater is embedded in the pressing member 121 of the pressurizing mechanism 120 and the cooling plate 150 is provided in the joint unit 71, the temperature of the superposed wafer $W_T$ can be finely adjusted and the temperature of the superposed wafer $W_T$ can be surely maintained at the second temperature at Step S5 performed in the joint unit 71. Further, the heating or cooling of the superposed wafer $W_T$ can also be rapidly performed.

Further, since the cooling plate 171 is provided in the post-thermal processing unit 72, the temperature of the superposed wafer $W_T$ can be finely adjusted and the cooling rate of the superposed wafer $W_T$ can be maintained at the predetermined cooling rate at Step S6 performed in the post-thermal processing unit 72. Accordingly, it is possible to prevent change in strength and physical property of the joint portions $J_U$, $J_L$ in the superposed wafer $W_T$.

Further, the first thermal processing plate 90 can transfer the superposed wafer $W_T$ from the pre-thermal processing unit 70 to the joint unit 71 and thus can heat the superposed wafer $W_T$ while transferring the superposed wafer $W_T$. Furthermore, the third thermal processing plate 170 can transfer the superposed wafer $W_T$ from the joint unit 71 to the post-thermal processing unit 72 and thus can cool the superposed wafer $W_T$ while transferring the superposed wafer $W_T$. Accordingly, the throughput of the wafer joint processing can further be improved. Further, since there is no need to separately provide a transfer mechanism for transferring the superposed wafer $W_T$ between the pre-thermal processing unit 70 and the joint unit 71 and between the joint unit 71 and the post-thermal processing unit 72, and therefore it is possible to simplify the configurations of the joint apparatuses 40 to 43 and reduce the manufacturing cost of the joint apparatuses 40 to 43.

Further, the pressurizing mechanism 120 is provided at the ceiling plate 112 of the processing container 112, and the ceiling plate 112 and the pressurizing mechanism 120 are integrally movable in the vertical direction. Here, the stiffness of the pressurizing bellows 123 of the pressurizing mechanism 120 is greater than the stiffness of the shield bellows 113 of the processing container 110 as described above. According to this embodiment, since the ceiling plate 112 is lowered and then the pressing member 121 of the pressurizing mechanism 120 can be lowered, the superposed wafer $W_T$ can be surely pressed at a predetermined load even if the stiffness of the pressurizing bellows 123 is greater.

Figure 15:
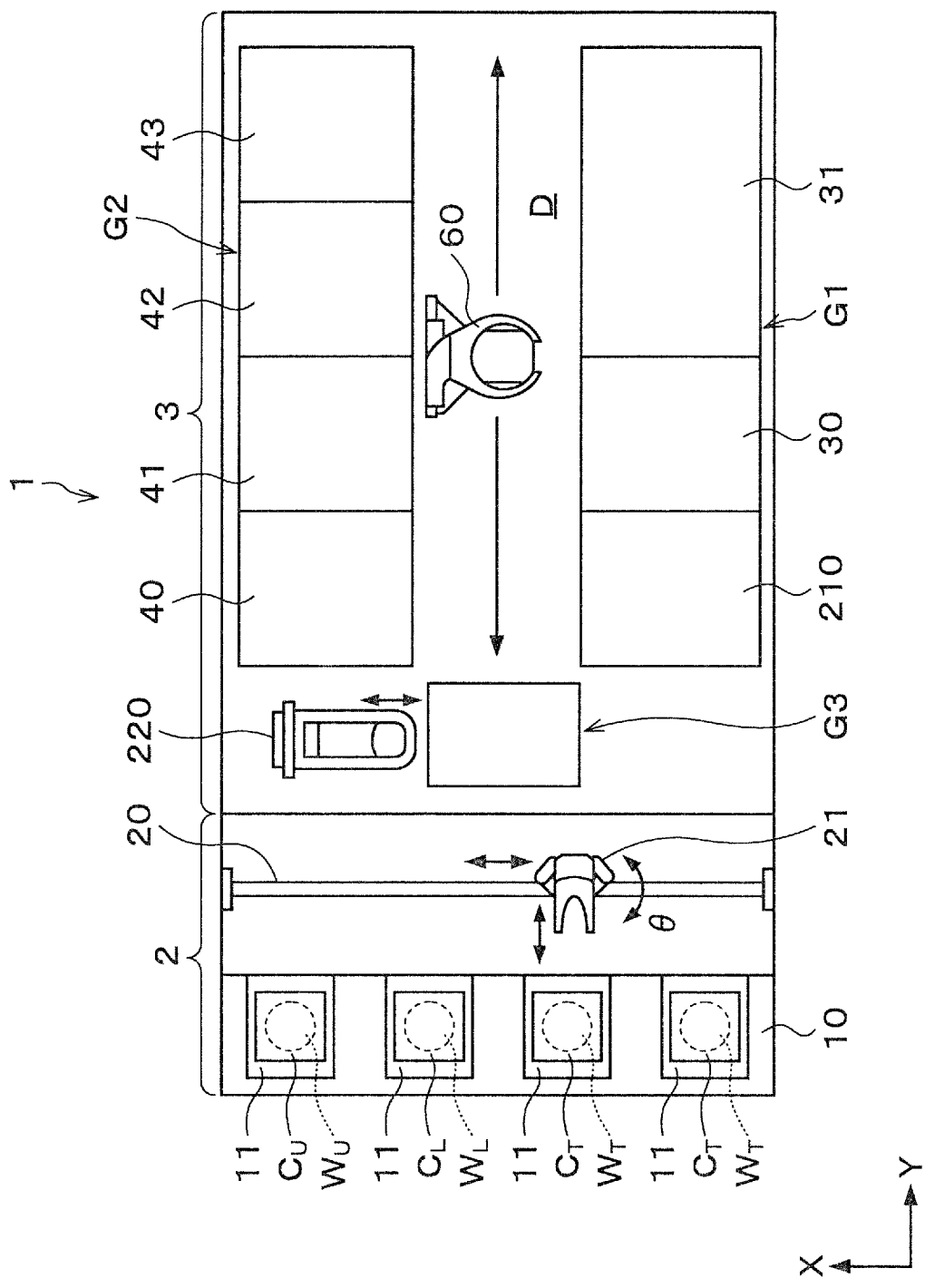
FIG. 15 A plan view illustrating the outline of the configuration of a joint system according to another embodiment.

In the joint system 1 in the above embodiment, an inspection apparatus 210 may further be provided in the first block G1 as illustrated in FIG. 15. The inspection apparatus 210 can inspect whether the superposed wafer $W_T$ joined in the joint apparatus 40 to 43 is appropriately joined. In this case, when the inspection apparatus 210 determines that the superposed wafer $W_T$ is not appropriately joined, the processing condition, for example, in the joint apparatus 40 to 43 can be corrected.

Further, in the joint system 1 of this embodiment, a wafer transfer apparatus 220 may be provided adjacent on the X-direction positive direction side to the third block G3 as illustrated in FIG. 15. The wafer transfer apparatus 220 has a transfer arm movable, for example, in the X-direction, the θ-direction and the vertical direction. The wafer transfer apparatus 210 moves up and down while supporting the wafer $W_U$, $W_L$ or the superposed wafer $W_T$ to be able to transfer the wafer $W_U$, $W_L$ or the superposed wafer $W_T$ to the transition apparatus 50 and the thermal processing apparatuses 51 to 53 in the third processing block G3. In this case, there is no need to use the wafer transfer apparatus 60 for the transfer of the wafers $W_U$, $W_L$ and the superposed wafer $W_T$ in the third processing block G3, and therefore it is possible to further improve the throughput of the wafer joint processing.

Further, though four joint apparatuses 40 to 43 are provided in the joint system 1 in the above embodiment, the number of joint apparatuses can be arbitrarily changed.

Further, the surface of the wafer $W_U$, $W_L$ is cleaned with the cleaning solution, that is, subjected to wet cleaning in the cleaning apparatus 30 in the above embodiment, but may be subjected to dry cleaning. In the case of performing dry cleaning, for example, plasma may be excited in the cleaning apparatus 30 to clean the surface of the wafer $W_U$, $W_L$.

Further, though aluminum and germanium are used for the joint portions $J_U$, $J_L$ respectively in the above embodiment, the present invention is applicable to the case of using other metals. In this case, the processing condition in the joint unit 71, for example, the heating temperature, the pressing load and so on for the superposed wafer $W_T$ are determined depending on the kinds of metal used for the joint portions $J_U$, $J_L$. Furthermore, though the metal joint portions $J_U$, $J_L$ are provided on the wafers $W_U$, $W_L$ in the above embodiment, the present invention is also applicable to the case where the substrate itself is metal. Further, the present invention is also applicable to the case where the substrate is a substrate other than the wafer, such as an FPD (Flat Panel Display), a mask reticle for photomask.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

INDUSTRIAL APPLICABILITY

The present invention is useful when joining substrates having metal joint portions.

EXPLANATION OF CODES

1 joint system
2 cassette station
3 processing station
30 cleaning apparatus
31 alignment apparatus
40 to 43 joint apparatus
50 transition apparatus
51 to 53 thermal processing apparatus
70 pre-thermal processing unit
71 joint unit
72 post-thermal processing unit
80 processing container
84 intake port
85 vacuum pump
86 intake pipe
90 first thermal processing plate
100 supporting member
101 rail
102 drive part
110 processing container
111 container body
112 ceiling plate
113 shield bellows
116 intake port
117 vacuum pump
118 intake pipe
120 pressurizing mechanism
121 pressing member
122 supporting member
123 pressurizing bellows
130 holding arm
140 second thermal processing plate
150 cooling plate
160 processing container
164 intake port
165 vacuum pump
166 intake pipe
170 third processing plate
171 cooling plate
180 supporting member
181 rail
182 drive part
200 control unit
$J_U$, $J_L$ joint portion
$W_U$ upper wafer
$W_L$ lower wafer
$W_T$ superposed wafer

What is claimed:

1. A joint apparatus joining substrates having metal joint portions, comprising:
   a pre-thermal processing unit comprising a first thermal processing plate mounting and thermally processing a superposed substrate in which the substrates are superposed on each other with the joint portions in contact with each other, and a first pressure reducing mechanism reducing a pressure of an atmosphere therein down to a predetermined degree of vacuum;
   a joint unit comprising a second thermal processing plate mounting and thermally processing the superposed substrate processed in said pre-thermal processing unit, a pressurizing mechanism pressing the superposed substrate on the second thermal processing plate toward the second thermal processing plate side, and a second pressure reducing mechanism reducing a pressure of an atmosphere therein down to a predetermined degree of vacuum; and
   a post-thermal processing unit comprising a third thermal processing plate mounting and thermally processing the superposed substrate processed in said joint unit, and a third pressure reducing mechanism reducing a pressure of an atmosphere therein down to a predetermined degree of vacuum,
   wherein each of said pre-thermal processing unit and said post-thermal processing unit is hermetically connected to said joint unit.

2. The joint apparatus as set forth in claim 1,
   wherein said pre-thermal processing unit has a moving mechanism moving the first thermal processing plate to/from said joint unit, and
   wherein said post-thermal processing unit has a moving mechanism moving the third thermal processing plate to/from said joint unit.

3. The joint apparatus as set forth in claim 2,
   wherein the pressurizing mechanism has a pressing member coming into contact with and pressing the superposed substrate on the second thermal processing plate while thermally processing the superposed substrate.

4. The joint apparatus as set forth in claim 3,
   wherein said joint unit has a cooling plate cooling the superposed substrate on the second thermal processing plate.

5. The joint apparatus as set forth in claim 4,
wherein said post-thermal processing unit has a cooling plate cooling the superposed substrate on the third thermal processing plate.

6. The joint apparatus as set forth in claim 5,
wherein the pressurizing mechanism is provided at a ceiling plate of said joint unit, and
wherein the ceiling plate is movable in a vertical direction.

7. A joint method of joining substrates having metal joint portions, comprising:
  a pre-thermal processing step of mounting a superposed substrate in which the substrates are superposed on each other with the joint portions in contact with each other, on a first thermal processing plate and heating the superposed substrate up to a first temperature in a pre-thermal processing unit;
  a joint step of then mounting the superposed substrate on a second thermal processing plate and pressing the superposed substrate toward the second thermal processing plate side while maintaining the superposed substrate at a second temperature higher than the first temperature to join the superposed substrate in a joint unit having an atmosphere therein set at a predetermined degree of vacuum; and
  a post-thermal processing step of then mounting the superposed substrate on a third thermal processing plate and cooling the superposed substrate down to a third temperature lower than the second temperature in a post-thermal processing unit,
  wherein during a time when performing said joint step on one superposed substrate, said pre-thermal processing step or said post-thermal processing step is performed on another superposed substrate.

8. The joint method as set forth in claim 7,
wherein in said pre-thermal processing step, the first thermal processing plate heats the superposed substrate while transferring the superposed substrate from the pre-thermal processing unit to the joint unit, and
wherein in said post-thermal processing step, the third thermal processing plate cools the superposed substrate while transferring the superposed substrate from the joint unit to the post-thermal processing unit.

9. A non-transitory computer-readable storage medium having a program stored therein, the program running on a computer of a control unit controlling a joint apparatus to cause the joint apparatus to execute a joint method of joining substrates having metal joint portions,
  said joint method comprising:
  a pre-thermal processing step of mounting a superposed substrate in which the substrates are superposed on each other with the joint portions in contact with each other, on a first thermal processing plate and heating the superposed substrate up to a first temperature in a pre-thermal processing unit;
  a joint step of then mounting the superposed substrate on a second thermal processing plate and pressing the superposed substrate toward the second thermal processing plate side while maintaining the superposed substrate at a second temperature higher than the first temperature to join the superposed substrate in a joint unit having an atmosphere therein set at a predetermined degree of vacuum; and
  a post-thermal processing step of then mounting the superposed substrate on a third thermal processing plate and cooling the superposed substrate down to a third temperature lower than the second temperature in a post-thermal processing unit,
  wherein during a time when performing said joint step on one superposed substrate, said pre-thermal processing step or said post-thermal processing step is performed on another superposed substrate.

* * * * *